Oct. 14, 1969

R. L. JAMES 3,473,043

GAIN ADJUSTMENT NETWORK FOR MULTIPLYING AND DIVIDING INPUT SIGNALS

Filed March 25, 1968

2 Sheets-Sheet 1

INVENTOR.
ROBERT L. JAMES

BY [signature]

ATTORNEY

Oct. 14, 1969 R. L. JAMES 3,473,043

GAIN ADJUSTMENT NETWORK FOR MULTIPLYING AND DIVIDING INPUT SIGNALS

Filed March 25, 1968 2 Sheets-Sheet 2

INVENTOR.
ROBERT L. JAMES
BY Anthony F. Cuoco
ATTORNEY 3,473,043
GAIN ADJUSTMENT NETWORK FOR MULTIPLYING AND DIVIDING INPUT SIGNALS Robert L. James, Bloomfield, N.J., assignor to The Bendix Corporation, a corporation of Delaware Filed Mar. 25, 1968, Ser. No. 715,810
Int. Cl. G06g 7/16
U.S. Cl. 307—230 10 Claims

ABSTRACT OF THE DISCLOSURE

A network for adjusting the gain of an input signal including an amplifier for providing an output in response to a control signal. A first switch is responsive to the amplifier output for gating a reference signal to a first filter and a second switch is responsive to said output for gating the input signal to a second filter. The amplifier output and the output from the first filter are fed back in opposite senses to the amplifier for affecting a control thereon so that the output from the network is proportional to the input signal by the ratio of the control signal to the reference signal.

BACKGROUND OF THE INVENTION

Field of the invention

This invention relates to gain adjustment network and, more particularly, to a network for providing a voltage controlled gain adjustment to an input signal.

Description of the prior art

Prior to the present invention devices of the type described required bulky electromechanical apparatus having slow response, or electronic apparatus having complex and costly circuitry. The network of the invention overcomes these disadvantages by featuring simplicity, reduced weight and volume and increased reliability.

SUMMARY

This invention contemplates a network for adjusting the gain of an input signal. A control signal is applied to an amplifier for effecting a change in the amplifier output, and which output is fed back in a positive sense to the amplifier for driving the amplifier to saturation in the positive sense whereupon the amplifier output renders a first switch conductive for applying a reference signal to a first filter. The output from the first filter is fed back in a negative sense to the amplifier and when the filter output slightly exceeds the control signal the amplifier is driven to saturation in the negative sense whereupon the amplifier output renders the first switch nonconductive to block the reference signal. The amplifier output renders a second switch alternately conductive and nonconductive, and which second switch gates the input signal to a second filter. The output from the second filter is applied to another amplifier, the output of which is proportional to the input signal by the ratio of the control signal to the reference signal.

One object of the invention is to provide a gain adjustment circuit having reduced weight and volume, relative simplicity, increased reliability and fast response.

Another object of the invention is to provide a voltage controlled gain adjustment to an input signal.

Another object of this invention is to provide a signal multiplier or divider.

Another object of the invention is to provide a gain adjustment network, and in which network pulse generation and signal modulation are combined.

Another object of this invention is to provide a circuit of the type described and in which circuit negative feedback stabilizes the signal modulation function.

The foregoing and other objects and advantages of the invention will appear more fully hereinafter from a consideration of the detailed description which follows, taken together with the accompanying drawings wherein one embodiment of the invention is illustrated by way of example. It is to be expressly understood, however, that the drawings are for illustration purposes only and are not to be construed as defining the limits of the invention.

DESCRIPTION OF THE INVENTION

Figure 1:
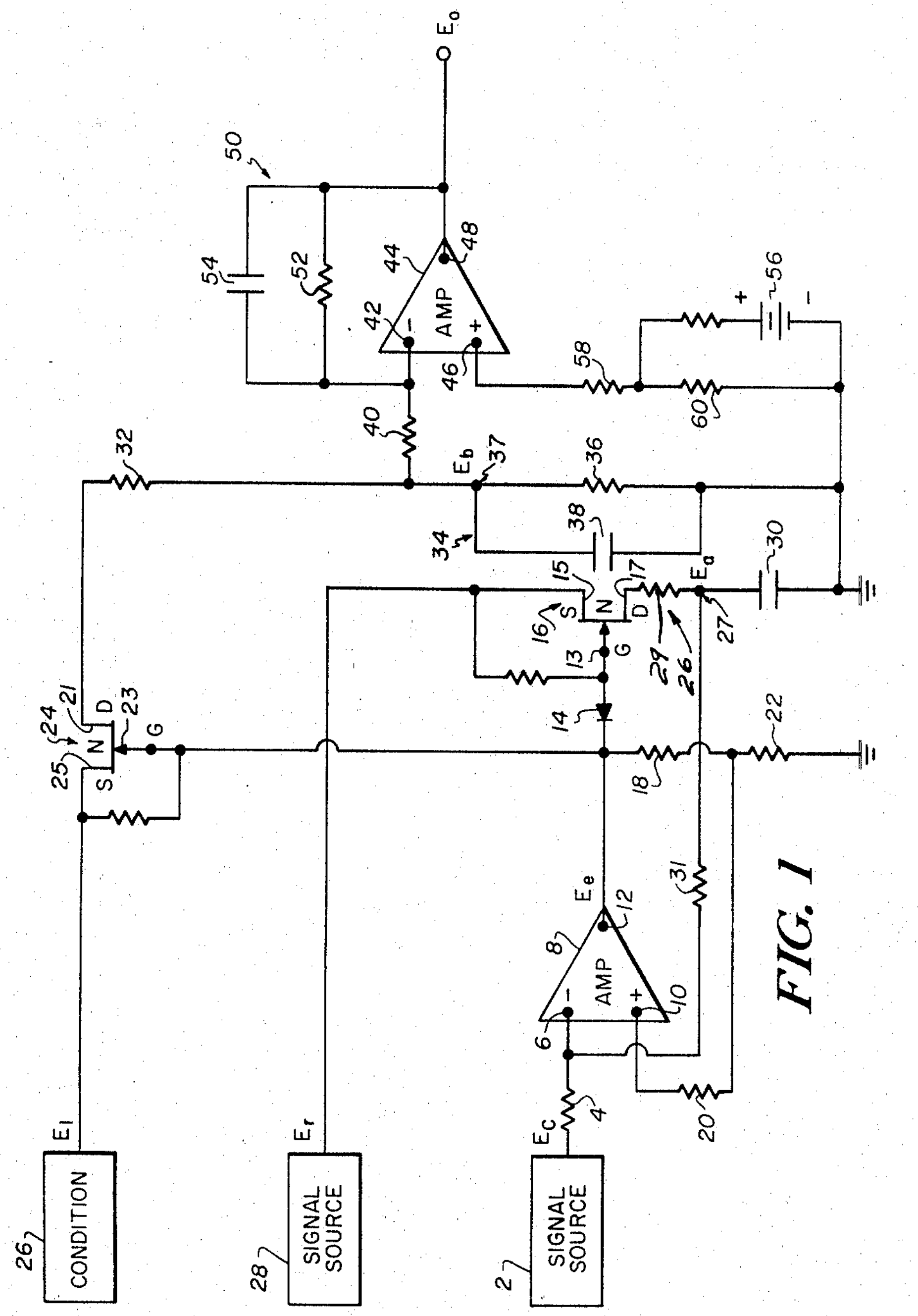
FIGURE 1 is an electrical schematic diagram of a device according to the invention.
Figure 2:
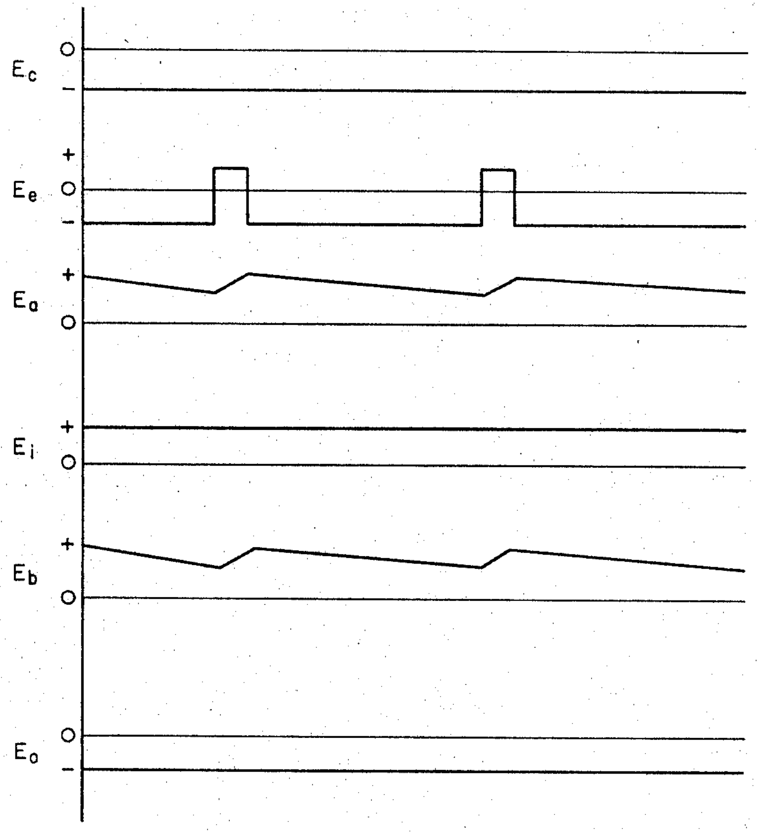
FIGURE 2 is a graphical illustration showing waveforms of signals provided at various stages of operation of the device shown in FIGURE 2.

Referring to FIGURE 1, a signal source 2 provides a constant negative direct current control signal $E_c$ having a waveform as shown in FIGURE 2, and which signal $E_c$ is applied through a resistor 4 to an inverting input terminal 6 of an amplifier 8. Amplifier 8 has a non-inverting input terminal 10 and an output terminal 12.

Amplifier 8 provides at output terminal 12 a signal $E_e$ which is applied through a diode 14 to a gate element 13 of an N-channel unipolar transistor 16. Transistor 16 has a source element 15 and a drain element 17. Signal $E_e$ is applied to non-inverting input terminal 10 of amplifier 8 through a resistor 18, and through a resistor 20 connected intermediate resistor 18 and a grounded resistor 22 and connected to non-inverting input terminal 10. Signal $E_e$ is applied to a gate element 23 of an N-channel unipolar transistor 24, and which transistor 24 has a drain element 21 and a source element 25. Source element 25 is connected to a device such as a condition sensor 26 which provides a constant positive direct current input signal $E_i$ having a waveform as shown in FIGURE 2 and corresponding, for purposes of example, to an aircraft flight condition.

A signal source 28 provides a constant direct current reference signal $E_r$, and which signal $E_r$ is applied to source element 15 of field effect transistor 16. Drain element 17 of transistor 16 is connected to a resistor 29, and which resistor 29 s connected to a grounded capacitor 30. Resistor 29, capacitor 30 and a resistor 31 provide a filter 26, and which filter 26 provides at a point 27 intermediate resistor 29 and capacitor 30 a signal designated as $E_a$. Signal $E_a$ is fed back through resistor 31 to inverting input 6 of amplifier 8.

Signal $E_c$, applied to inverting input 6 of amplifier 8, effects a change in signal $E_e$ at output terminal 12 of amplified 8, and which signal $E_e$ is applied through resistors 18 and 20 to non-inverting input terminal 10 of amplifier 8. When signal $E_e$ exceeds a predetermined threshold, amplifier 8 is driven to positive saturation to provide signal $E_e$ at a maximum positive level. Signal $E_e$ is then effective for rendering transistor 16 conductive whereby reference signal $E_r$ from signal source 28 is applied to filter 26.

Signal $E_a$ from filter 26 is applied through resistor 31 to inverting input 6 of amplifier 8 and when signal $E_a$ slightly exceeds control signal $E_c$ from signal source 2, amplifier 8 is driven to negative saturation whereby switch 16 is rendered nonconductive and signal $E_r$ from signal source 28 is blocked. Signal $E_a$ from filter 26 is discharged toward ground level and when signal $E_a$ becomes less than signal $E_c$, amplifier 8 is switched back to positive saturation. The cycle repeats causing signal $E_a$ from filter 26 to be a ramp type signal having a waveform as shown in FIGURE 2 and differing from control signal $E_c$ by a small ripple error voltage; i.e., that voltage required to switch amplifier 8 from saturation of one polarity to saturation of the other polarity, and causing signal $E_e$ at output 12 of amplifier 8 to be a pulse train having a waveform as shown in FIGURE 2.

Drain element 21 of transistor 24 is connected through a resistor 32 and a resistor 40 to an inverting input terminal 42 of an amplifier 44. Amplifier 44 has a non-inverting input terminal 46 and an output terminal 48. Drain element 21 is connected through resistor 32 to a filter 34 including a resistor 36, a capacitor 38 connected across resistor 36, resistor 32 and resistor 40. Amplifier 44 provides a constant level negative direct current output signal $E_o$ at output terminal 48 which is related to input signal $E_i$ as will be hereinafter shown.

Signal $E_o$ is fed back to inverting terminal 42 of amplifier 44 through a filter 50 including a resistor 52 and a capacitor 54 connected across resistor 52. A positive source of direct current such as a battery 56 is connected intermediate a resistor 58 and a grounded resistor 60, and which resistor 58 is connected to non-inverting input terminal 46 of amplifier 44.

Signal $E_e$ from output terminal 12 of amplifier 8 is applied to transistor 24 and renders transistor 24 conductive and nonconductive as heretofore described with reference to transistor 16. Transistor 24 in turn alternately permits and blocks the passage of signal $E_i$ to filter 34.

The arrangement is such that capacitor 30 is equivalent to capacitor 38, resistor 28 is equivalent to resistor 32 and resistor 40, in parallel with capacitor 38, is equivalent to resistor 31. Filter 34 is thereby identical to filter 26 and thus provides an output $E_b$ at a point 37 and which output $E_b$ has a waveform as shown in FIGURE 2. In this connection it is to be noted that since switches 16 and 24 are the same, filters 28 and 34 are the same and pulse train $E_e$ operates both of said switches 28 and 34, signal $E_b$ is the same as signal $E_a$ and hence the same as control signal $E_c$ except for the ripple voltage as heretofore noted and as illustrated in FIGURE 2. This is true providing input signal $E_i$ is the same as reference voltage $E_r$. If $E_i$ is not the same as $E_r$, then signal $E_b$ is related to signal $E_e$ in the ratio: $E_i/E_r$, and $$E_a = -E_c \quad (1)$$

$$E_a = KE_r \quad (2)$$

Therefore $$-E_c = KE_r \quad (3)$$

and $$K = \frac{-E_o}{E_r} \quad (4)$$

$$E_o = KK_1E_i \quad (5)$$

$$E_o = -K_1\frac{E_c}{E_r}E_i \quad (6)$$

where $E_a$ is the output of filter 26, $E_r$ is a constant D.C. reference signal as heretofore noted, $K_1$ is the constant gain factor of amplifier 42 and K is a proportionality factor dependent on the duty cycle of pulse train $E_e$ from amplifier 8 and the characteristics of switches 16 and 24 and filters 26 and 34. In this connection it is to be noted that proportionality factor K is the same in Equations 2 and 5 since the switching and filter circuits are identical and the same pulse train ($E_e$) drives transistors 16 and 24. From Equation 6 it is seen that if the independent variables are $E_c$ and $E_i$, the circuit is a two-quadrant multiplier and if the independent variables are $E_r$ and $E_i$ the circuit is a two-quadrant divider.

Referring to the electrical schematic diagram of FIGURE 1, resistor 31 controls the negative feedback ratio of amplifier 8. The greater the negative feedback the higher will be the threshold of amplifier 8 to control signal $E_c$. Below this threshold signal $E_c$ will not produce pulse train $E_e$ at output terminal 12 of amplifier 8 and circuit gain for input signal $E_i$ will be zero.

In this connection it is to be noted that amplifier 8 is in a condition of negative saturation when control signal $E_c$ is zero. This is the result of slight input offset of either polarity and external positive feedback applied around amplifier 8. Control signal $E_c$ must overcome this positive feedback before any action occurs to provide pulse train $E_e$.

The threshold voltage is designated as $E_t$ and is given by the following equation:

$$E_t = E\frac{R_{22}}{R_{22}+R_{18}} \quad (7)$$

Resistors 18 and 22 may thus be adjusted to provide the desired circuit performance.

Resistor 60 and the polarity of the D.C. voltage provided by battery 56 are selected to balance the output offset or drift of amplifier 44 to zero for a zero input signal from filter 34. Amplifier 44 is used to adjust circuit gain to a desired value and filter 50 provides additional ripple reduction. Since the functional operation of the circuit occurs between the input and the output of filter 34, some applications may have no need for amplifier 44.

The network of the present invention provides means whereby pulse generation and signal modulation are combined in a novel manner. Moreover, the negative feedback provided in the network is used to stabilize the signal modulation function.

It may be seen by referring to FIGURE 1 that pulse generation is accomplished by amplifier 8 and by the positive and negative feedback paths connected thereto, while signal modulation is accomplished by field effect transistor 24. The signal modulation is stabilized by negative feedback since any drift of amplifier 8 is prevented by said negative feedback. This is accomplished since the negative feedback, which is a D.C. signal generated by output pulse train $E_e$ of amplifier 8, is compared to signal $E_c$. If the compared signals are not equal, the error signal affects amplifier 8 so that the frequency and duration of pulses $E_e$ change until the compared signals are equal.

Sufficient gain is provided in the network so that the two signals (D.C. signal and signal $E_c$) are nearly equal regardless of environmental factors. Also, since filters 26 and 34 and transistors 16 and 24 are equivalent, and the transistors are both responsive to pulses $E_e$, the only difference between each filter-transistors circuit is any inequality between reference signal $E_r$ and input signal $E_i$. This inequality has merely a linear effect on the network output. If input signal $E_i$ is changed and reference signal $E_r$ remains constant, the pulse output remains the same as long as control signal $E_c$ is not changed. Thus, it is realized that the D.C. component of filter 34 output depends only on the input signal in a linear relationship.

Although but a single embodiment of the invention has been illustrated and described in detail, it is to be expressly understood that the invention is not limited thereto. Various changes may also be made in the design and arrangement of the parts without departing from the spirit and scope of the invention as the same will now be understood by those skilled in the art.

What is claimed is:

1. A network for adjusting the gain of an input signal from a signal source comprising:

means for providing a control signal;

means for providing a reference signal;

an amplifier connected to the control signal means and responsive to the control signal therefrom for providing an output signal;

filter means;

switching means connecting the filter means to the amplifier and connected to the signal source and to the reference signal means, and affected by the amplifier output signal for gating the input signal and the reference signal to the filter means so that said filter means provides an output signal in response to the signals gated thereto; and means connected to the filter means and responsive to the output therefrom for providing a network output signal proportional to the input signal by the ratio of the control signal to the reference signal.

2. A network as described by claim 1, wherein the amplifier has an inverting input terminal, a non-inverting input terminal and an output terminal, and the network includes:

feedback means for connecting the amplifier output terminal to the non-inverting input terminal so as to drive the amplifier to saturation in one sense when the amplifier output signal exceeds a predetermined threshold;

the amplifier output terminal being connected to the switching means for rendering said switching means effective to apply the reference signal to the filter means when the amplifier is saturated in the one sense;

other feedback means for connecting the filter means to the inverting input terminal of the amplifier so as to drive the amplifier to saturation in the opposite sense when the filter output exceeds the control signal; and the switching means being rendered effective for blocking the reference signal when the amplifier is saturated in the other sense.

3. A network as described by claim 2, wherein:

the filter means includes a first filter and a second filter;

the switching means includes a first transistor and a second transistor;

the first filter is connected to the first transistor and to the inverting input terminal of the amplifier; and the second filter is connected to the second transistor and to the means for providing a network output signal proportional to the input signal by the ratio of the control signal to the reference signal.

4. A network as described by claim 3, wherein:

the first transistor includes gate, source and drain elements;

the amplifier output terminal is connected to the gate element;

the reference signal source is connected to the source element; and the first filter is connected to the drain element.

5. A network as described by claim 3, wherein:

the second transistor includes gate, source and drain elements;

the signal source is connected to the source element;

the amplifier output terminal is connected to the gate element; and the second filter is connected to the drain element.

6. A network as described by claim 2, wherein: the control signal means is connected to the inverting input of the amplifier.

7. A network as described by claim 2, wherein: the other feedback means includes a resistor for controlling the level at which the amplifier will switch to saturation in the other sense in response to the control signal.

8. A network as described by claim 3, wherein:

the means connected to the filter means and responsive to the output therefrom for providing a network output signal proportional to the input signal by the ratio of the control signal to the reference signal includes:

another amplifier having an inverting input terminal, a non-inverting input terminal and an output terminal at which the network output signal is provided; and the second switch connects the second filter to the inverting input.

9. A network as described by claim 8, including: a signal source connected to the non-inverting input terminal of the other amplifier and providing a signal to compensate for amplifier drift.

10. A network as described by claim 9, including: another filter connected in feedback configuration to the output and to the inverting input of the other amplifier to compensate for ripple voltages.

References Cited

UNITED STATES PATENTS 2,966,307 12/1960 Schmid ............ 235—196

ROY LAKE, Primary Examiner

JAMES B. MULLINS, Assistant Examiner

U.S. Cl. X.R.

235—194; 307—304; 328—160, 161